(12) United States Patent
Franck et al.

(10) Patent No.: US 6,633,447 B2
(45) Date of Patent: Oct. 14, 2003

(54) METHOD AND APPARATUS FOR COMPENSATION OF SECOND ORDER DISTORTION

(75) Inventors: Stephen J. Franck, Felton, CA (US); Thomas Blon, Santa Cruz, CA (US)

(73) Assignee: Infineon Technologies AG (DE)

( * ) Notice: Subject to any disclaimer, the term of this patent is extended or adjusted under 35 U.S.C. 154(b) by 306 days.

(21) Appl. No.: 09/865,790

(22) Filed: May 25, 2001

(65) Prior Publication Data

US 2002/0176197 A1 Nov. 28, 2002

(51) Int. Cl.[7] .................................................. G11B 5/02
(52) U.S. Cl. ............................. 360/67; 360/46; 360/25; 360/53
(58) Field of Search ............................. 360/46, 67, 25, 360/53, 65, 32; 341/126, 155; 327/133, 317, 553; 330/268, 254, 278

(56) References Cited

U.S. PATENT DOCUMENTS 5,418,660 A * 5/1995 Sato .............................. 360/65
6,510,012 B1 * 1/2003 Chaiken ....................... 360/25

* cited by examiner

*Primary Examiner*—Alan T. Faber
(74) *Attorney, Agent, or Firm*—Brinks Hofer Gilson & Lione (57) ABSTRACT

A method and apparatus for removing second order distortion is disclosed. The method couples a differential load between two source followers of a gain stage. The apparatus includes a differential load having two MOS transistors of unequal channel width/length ratios. The differential load implements a square and summing function in a single circuit eliminating the need to split the signal path.

30 Claims, 4 Drawing Sheets

METHOD AND APPARATUS FOR COMPENSATION OF SECOND ORDER DISTORTION

BACKGROUND

Computer hard disk drives, also known as fixed disk drives or hard drives, have become a de facto standard data storage component of modern computer systems and are making further inroads into modem consumer electronics as well. Their proliferation can be directly attributed to their low cost, high storage capacity and high reliability, in addition to wide availability, low power consumption, high data transfer speeds and decreasing physical size.

These disk drives typically consist of one or more rotating magnetic platters encased within an environmentally controlled housing that further includes all of the electronics and mechanics to read and write data and interface with other devices. Read/write heads are positioned above each of the platters, and typically on each face, to record and read data. The electronics of a hard disk drive are coupled with these read/write heads and include numerous components to control the position of the heads and generate or sense the electromagnetic fields representing data. These components receive data from a host device, such as a personal computer, and translate that data into magnetic encodings written onto the disk platters by the heads. Further, when a host device requests data from the drive, the electronics locate the desired data, sense the magnetic encodings which represent that data and translate those encodings back into the binary digital information which the host device can understand. Further, error detection and correction algorithms are applied to ensure accurate storage and retrieval of data.

One area in which significant advancements have been made has been in the area of read/write head technology and the methods of interpreting the magnetic fluctuations sensed by these heads. The read/write head, of which a typical hard disk has several, is the interface between magnetic platters and the disk drive electronics. The read/write head actually reads and writes the magnetically encoded data as areas of magnetic flux on the platters. Data, consisting of binary 1's and 0's, are encoded by sequences of the presence or absence of flux reversals recorded or detected by the read/write head. A flux reversal is a change in the magnetic flux in two contiguous areas of the disk platter. Traditional hard drives read data off the platters by detecting the voltage peak imparted in the read/write head when a flux reversal passes underneath the read/write head as the platters rotate. This is known as "peak detection."However, increasing storage densities require reduced peak amplitudes and better signal discrimination and higher platter rotational speeds are pushing the peaks closer together thus making peak detection more difficult to accomplish.

Magneto-resistive ("MR") read/write heads have been developed with increased sensitivity to sense smaller amplitude magnetic signals and with increased signal discrimination to address some of the problems with increasing storage densities. In addition, another technology, known as Partial Response Maximum Likelihood ("PRML"), has been developed to further address the problems with peak detection as densities and rotational speeds increase. Borrowed from communications technology, PRML is an algorithm implemented in the disk drive electronics to interpret the magnetic signals sensed by the read/write heads. PRML-based disk drives read the analog waveforms generated by the magnetic flux reversals stored on the disk. However, instead of looking for peak values to indicate flux reversals, PRML-based drives digitally sample this analog waveform (the "Partial Response") and use advanced signal processing technologies to determine the bit pattern represented by that wave form (the "Maximum Likelihood"). This technology, in conjunction magneto-resistive ("MR") heads, have permitted manufacturers to further increase data storage densities. PRML technology further tolerates more noise in the sensed magnetic signals permitting the use of lower quality platters and read/write heads which increases manufacturing yields and lowers costs.

With many different drives available from multiple manufacturers, hard disk drives are typically differentiated by factors such as cost/megabyte of storage, data transfer rate, power requirements and form factor (physical dimensions) with the bulk of competition based on cost. With most competition between hard disk drive manufacturers coming in the area of cost, there is a need for enhanced hard disk drive components which prove cost effective in increasing supplies and driving down manufacturing costs all while increasing storage capacity, operating speed, reliability and power efficiency

SUMMARY

The present invention is defined by the following claims, and nothing in this section should be taken as a limitation on those claims. By way of introduction, the preferred embodiments described below relate to a gain stage comprising a first source follower including a first transistor comprising a first source, a first gate and a first drain, the first drain coupled with a first current source and a first differential output, the first gate coupled with a first differential input, the first source coupled with a second current source. The gain stage also includes a second source follower including a second transistor comprising a second source, a second gate and a second drain, the second drain coupled with a third current source and a second differential output, the second gate coupled with a second differential input, the second source coupled with a fourth current source. The gain stage further comprises a distortion compensator coupled between the first source follower and the second source follower. The distortion compensator comprises a differential load wherein the distortion compensator is operative to remove second order distortion from a differential analog signal input to the first and second differential inputs.

The preferred embodiments further relate to a method of removing second order distortion from a differential analog input signal. In one embodiment, the method comprises receiving the first differential analog input signal to first and second source followers, processing the first differential analog input signal through a differential load, removing second order distortion from the first differential analog input signal.

Further aspects and advantages of the invention are discussed below in conjunction with the preferred embodiments.

DETAILED DESCRIPTION OF THE PRESENTLY PREFERRED EMBODIMENTS

The embodiments described herein relate to a PRML-based read/write channel device for hard disk drive controllers. The read/write channel is a device coupled with the read/write heads of the hard disk drive. Herein, the phrase "coupled with" is defined to mean directly connected to or indirectly connected with through one or more intermediate components. Such intermediate components may include both hardware and software based components. The read/write channel converts binary/digital data from the host device into the electrical impulses which drive the read/write head to magnetically record the data to the disk drive platters. Further, the read/write channel receives the analog waveform magnetically sensed by the read/write heads and converts that waveform back into the binary/digital data stored on the drive.

Figure 1A:
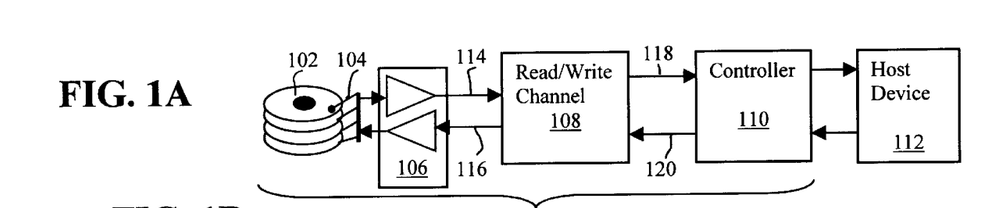
FIG. 1A depicts a block diagram of an exemplary hard disk drive coupled with a host device.

Referring to FIG. 1A, there is shown a block diagram of an exemplary hard disk drive 100 coupled with a host device 112. For clarity, some components, such as the servo/actuator motor control, are not shown. The drive 100 includes the magnetic platters and spindle motor 102, the read/write heads and actuator assembly 104, pre-amplifiers 106, a read/write channel 108 and a controller 110. The pre-amplifiers 106 are coupled with the read/write channel 108 via interfaces 114, 116. The controller 110 interfaces with the read/write channel 108 via interfaces 118, 120.

For reads from the hard disk 100, the host device 112 provides a location identifier which identifies the location of the data on the disk drive, e.g. a cylinder and sector address. The controller 110 receives this address and determines the physical location of the data on the platters 102. The controller 110 then moves the read/write heads into the proper position for the data to spin underneath the read/write heads 104. As the data spins underneath the read/write head 104, the read/write head 104 senses the presence or absence of flux reversals, generating a stream of analog signal data. This data is passed to the pre-amplifiers 106 which amplifies the signal and passes it to the read/write channel 108 via the interface 114. As will be discussed below, the read/write channel receives the amplified analog waveform from the pre-amplifiers 106 and decodes this waveform into the digital binary data that it represents. This digital binary data is then passed to the controller 110 via the interface 118. The controller 110 interfaces the hard drive 100 with the host device 112 and may contain additional functionality, such as caching or error detection/correction functionality, intended to increase the operating speed and/or reliability of the hard drive 100.

For write operations, the host device 112 provides the controller 110 with the binary digital data to be written and the location, e.g. cylinder and sector address, of where to write it. The controller 110 moves the read/write heads 104 to the proper location and sends the binary digital data to be written to the read/write channel 108 via interface 120. The read/write channel 108 receives the binary digital data, encodes it and generates analog signals which are used to drive the read/write head 104 to impart the proper magnetic flux reversals onto the magnetic platters 102 representing the binary digital data. The generated signals are passed to the pre-amplifiers 106 via interface 116 which drive the read/write heads 104.

Figure 1B:
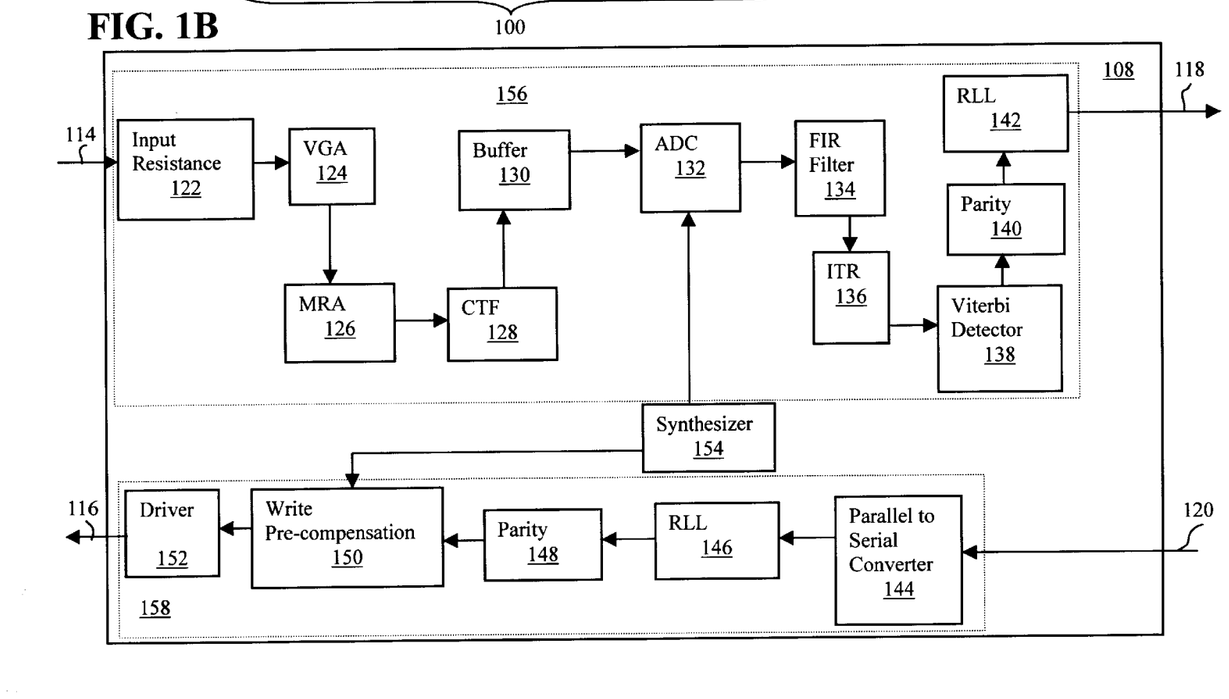
FIG. 1B depicts a block diagram of read/write channel for use with the disk drive of FIG. 1A.

Referring to FIG. 1B, there is shown an exemplary read/write channel 108 supporting Partial Response Maximum Likelihood ("PRML") encoding technology for use with the hard disk drive 100 of FIG. 1A. For clarity, some components have been omitted. The read/write channel 108 is implemented as an integrated circuit using a complementary metal oxide semiconductor ("CMOS") process at 0.18 micron. It will be appreciated that CMOS processes include processes which use metal gates as well as polysilicon gates. It will further be appreciated that other process technologies and feature sizes may used and that the circuitry disclosed herein may be further integrated with other circuitry comprising the hard disk electronics such as the hard disk controller logic. As was described, the read/write channel 108 converts between binary digital information and the analog signals representing the magnetic flux on the platters 102. The read/write channel 108 is divided into two main sections, the read path 156 and the write path 158.

The write path 158 includes a parallel-to-serial converter 144, a run-length-limited ("RLL") encoder 146, a parity encoder 148, a write pre-compensation circuit 150 and a driver circuit 152. The parallel-to-serial converter 144 receives data from the host device 112 via interface 120 eight bits at a time. The converter 144 serializes the input data and sends the serial bit stream to the RLL encoder 146. The RLL encoder 146 encodes the serial bit stream into symbolic binary sequences according to a known run-length limited algorithm for recording on the platters 102. The exemplary RLL encoder uses a 32/33 bit symbol code to ensure that flux reversals are properly spaced and that long runs of data without flux reversals are not recorded. The RLL encoded data is then passed to the parity encoder 148 which adds a parity bit to the data. In the exemplary parity encoder 148, odd parity is used to ensure that long run's of 0's and 1's are not recorded due to the magnetic properties of such recorded data. The parity encoded data is subsequently treated as an analog signal rather than a digital signal. The analog signal is passed to a write pre-compensation circuit 150 which dynamically adjusts the pulse widths of the bit stream to account for magnetic distortions in the recording process. The adjusted analog signal is passed to a driver circuit 152 which drives the signal to the pre-amplifiers 106 via interface 116 to drive the read/write heads 104 and record the data. The exemplary driver circuit 152 includes a pseudo emitter coupled logic ("PECL") driver circuit which generates a differential output to the pre-amplifiers 106.

The read path 156 includes an attenuation circuit/input resistance 122, a variable gain amplifier ("VGA") 124, a magneto-resistive asymmetry linearizer ("MRA") 126, a continuous time filter ("CTF") 128, a buffer 130, an analog to digital converter ("ADC") 132, a finite impulse response ("FIR") filter 134, an interpolated timing recovery ("ITR") circuit 136, a Viterbi algorithm detector 138, a parity decoder 140 and a run-length-limited ("RLL") decoder 142. The amplified magnetic signals sensed from the platters 102 by the read/write head 104 are received by the read/write channel 108 via interface 114. The analog signal waveform representing the sensed magnetic signals is first passed through an input resistance 122 which is a switching circuit to attenuate the signal and account for any input resistance. The attenuated signal is then passed to a VGA 124 which amplifies the signal. The amplified signal is then passed to the MRA 126 which adjusts the signal for any distortion created by the recording process. Essentially, the MRA 126 performs the opposite function of the write-pre-compensation circuit 150 in the write path 158. The signal is next passed through the CTF 128, which is essentially a low pass filter, to filter out noise. The filtered signal is then passed to the ADC 132 via the buffer 130 which samples the analog signal and converts it to a digital form. The digital signal is then passed to a FIR filter 134 and then to a timing recovery circuit 136. The timing recovery circuit 136 is connected (not shown in the figure) to the FIR filter 134, the MRA 126 and the VGA 124 in a feedback orientation to adjust these circuits according to the signals received to provide timing compensation. The exemplary FIR filter 134 is a 10 tap FIR filter. The digital signal is then passed to the Viterbi algorithm detector 138 which determines the binary bit pattern represented by the digital signal using digital signal processing techniques. The exemplary Viterbi algorithm detector 138 uses a 32 state Viterbi processor. The binary data represented by the digital signal is then passed to the parity decoder 140 which removes the parity bit and then to the RLL decoder 142 which decodes the binary RLL encoding symbols back into the actual binary data that they represents This data is then passed to the controller 110 via the interface 118.

The read/write channel 108 further includes a clock synthesizer 154. The clock synthesizer 154 generates the clock signals required for operating the read/write channel 108. The exemplary clock synthesizer 154 includes a phased lock look ("PLL") (not shown) with a voltage controlled oscillator and various clock dividers to generate the necessary frequencies.

Figure 2:
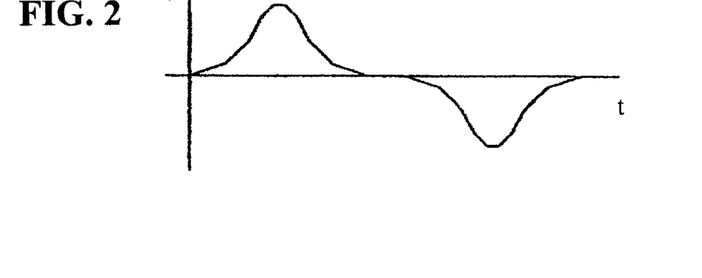
FIG. 2 depicts an ideal input pulse waveform.
Figure 3:
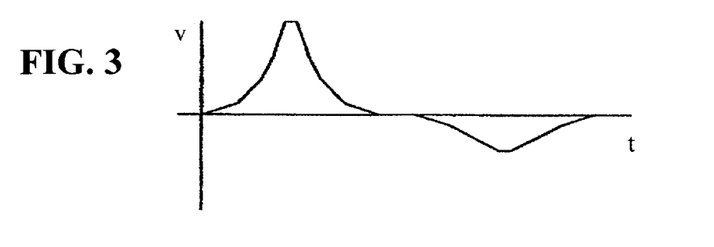
FIG. 3 depicts a non-ideal input pulse waveform with second order distortion.

As was described, the read channel 108 converts between binary digital data and an analog signal sensed by or driven to the read/write head 104. The analog signal is essentially a series of alternating positive and negative voltage pulses. In these systems, where pulses are used to store units of data, such as on magnetic media as described above, the pulses would ideally have symmetric shapes, i.e. if the shape of a pulse is described by the time domain function $x(t)=b\ h(t)$, then for $b=\pm 1$ the pulse would be symmetric to the time axis, as shown in FIG. 2, labeled "t". The multiplier, b, is a scalar which represents the polarity of the pulse being read back. However, due to non-ideal properties of the circuits which are used to read back pulses from the storage medium, this symmetry can be distorted. For magnetic media, a common type of distortion is introduced by a square term. In particular, the non-linear nature of MR read heads can introduce such distortion into the pulses sensed by the head 104. The distorted signal being read back can be described as (and shown in FIG. 3):

$$x(t)=b\ h(t)+a\ h(t)^2$$

where $b=\pm 1$ and a is a constant factor which describes the magnitude of the square term in the distorted signal and is typically in the range of $0 \ldots \pm 0.3$.

Such second-order distortion can cause errors in the interpretation of the pulses and their conversion back to binary digital data by the read path 156 of the read channel 108. Disclosed herein is an apparatus and method to subtract the square term from the incoming signal, x(t), in order to retrieve the linearized non-distorted signal, y(t). This is ideally done by using a square function on the incoming distorted signal, x(t), and then subtracting squared signal, multiplied with a linear factor, a, from x(t) as shown in FIG. 4 and described by the following equation:

$$y(t)=x(t)-a\ x^2(t)$$

Figure 4:
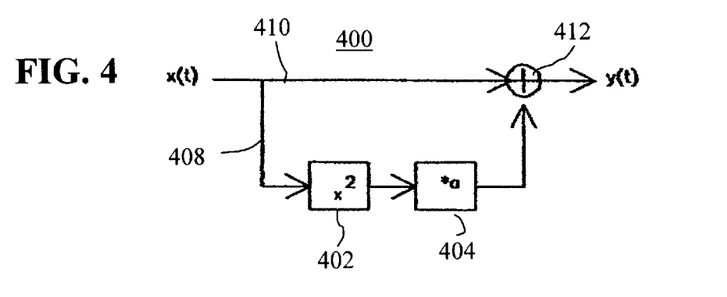
FIG. 4 depicts an ideal mixer circuit model for removing second order distortion.

FIG. 4 shows an ideal "mixer circuit" 400 which implements the above equation. The circuit 400 splits the distorted signal, labeled "x(t)" along two signal paths 408, 410. Signal path 408 is connected to a square term generator 402 which squares the signal, x(t), and then to a linear multiplier 404 and finally to a summation circuit 412. The signal path 410 is directly connected to the summation circuit 412. The output of summation circuit 412, labeled "y(t)", is the linearized non-distorted signal.

Figure 5:
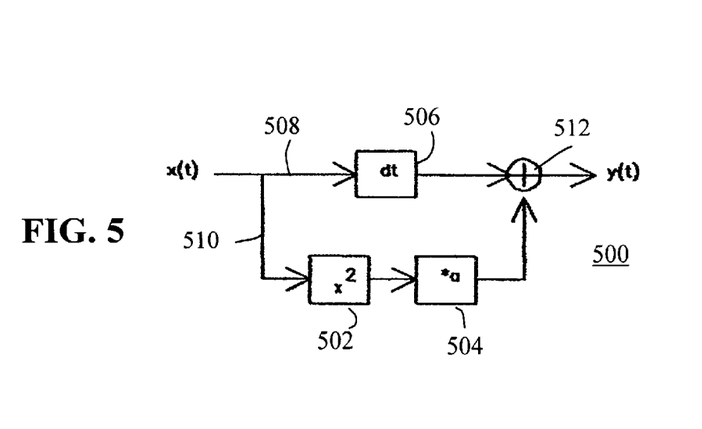
FIG. 5 depicts an exemplary mixer circuit for removing second order distortion.

U.S. Pat. Nos. 6,043,943 and 6,147,828 disclose mixer structures which generate a square function which can then be used to perform the subtraction function. Referring to FIG. 5, there is shown a simplified block diagram of a second order compensation circuit 500 using a mixer structure according to the above-referenced U.S. patents. As described above and shown in FIG. 4, a mixer structure divides the distorted input signal, labeled "x(t) ", along two signal paths 508, 510. Path 510 routes the distorted signal to a square term generator 502, then to a linear multiplier 504 and then sums the ±square term with original distorted signal from path 508 using a summing circuit 512 to obtain the linearized non-distorted signal, labeled "y(t)".

Unfortunately, as opposed to the ideal circuit depicted in FIG. 4, the square term 502 and multiplier 504 are non-ideal elements and introduce signal delay to the signal path 510 which must be compensated for in the signal path 508 for the summation 512 to operate properly. This compensating delay 506, labeled "dt," can be difficult to match with the circuit delay imparted by the square term 502 and linear multiplier 504.

Further, the above U.S. patents disclose circuits which use bi-polar transistors. What is needed is a second order compensation circuit which does not add delay to the signal path and which is capable of being implemented with a CMOS process.

The disclosed embodiments describe method and circuit for computing the square term and summation in a single circuit which does not require splitting the distorted signal along separate signal paths, and therefore no delay matching is required. Further, the disclosed circuits are capable of being implemented entirely in a CMOS process.

Figure 6:
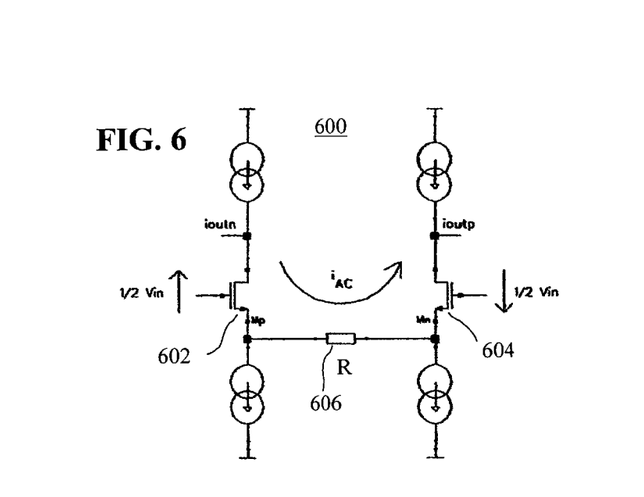
FIG. 6 depicts a schematic of an exemplary gain stage.

Referring now to FIG. 6, there is shown a simplified amplifier stage 600 consisting of two NMOS source followers 602, 604, labeled "Mp" and "Mn", and a differential load resistor 606, with a resistance, R. Provided that the transconductances, gm, of the transistors Mp and Mn 602, 604 are equal and $1/gm(Mp)=1/gm(Mn)<<R$ due to a not shown gain boosting mechanism, this stage translates a differential voltage, labeled "↑½ $v_{in}$" and "↓½ $v_{in}$" applied to the NMOS input transistors 602, 604 into a current:

$$i_{AC}=v_{in}/R$$

Figure 7:
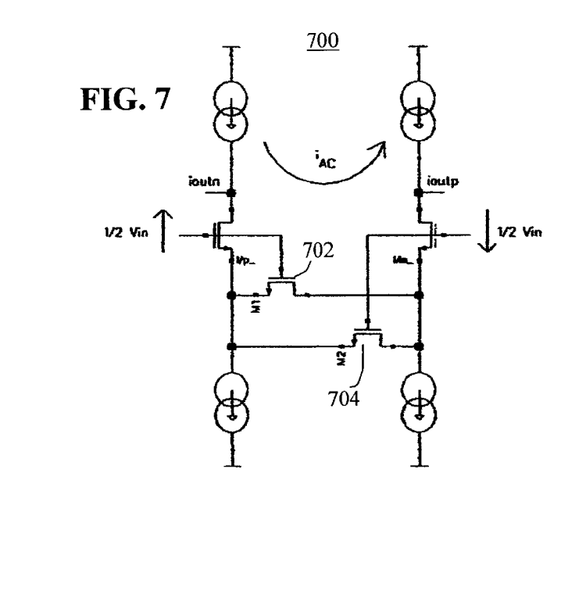
FIG. 7 depicts a schematic of a gain stage according to a first embodiment.

Referring now to FIG. 7, there is shown a simplified amplifier stage 700 similar to the stage 600 of FIG. 6. In this circuit 700, however, the differential load resistor 606 has been replaced with two NMOS transistors 702, 704, labeled "M1" and "M2," operated in the linear region. A first order model for the current through a MOS transistor operated in the linear region is:

$$I_{ds}=\beta[(V_{gs}-V_t)V_{ds}-\tfrac{1}{2}V_{ds}^2], \quad \beta=\mu C_{ox}W/L$$

Assuming that the ratio of the channel width-to-length, shown as "W/L", of M1 and M2 are not set equal but rather asymmetric according to the following the formulas:

For M1: $W_1/L=(1+a)$ W/L; and

For M2: $W_2/L=(1-a)$W/L with a=0 . . . 1 then the two equations for the loop current $i_{AC}$ of the structure in FIG. 6 can be set up considering the two cases $v_{in}>0V$ and $v_{in}<0V$, as follows:

$v_{in}>0V$:

$$i_{ACP}=\beta\{(1+a)[(V_{gs0}+v_{in}-V_t)v_{in}-\tfrac{1}{2}V_{in}^2]+(1-a)[(V_{gs0}-V_t)v_{in}-\tfrac{1}{2}V_{in}^2]\}$$

$$i_{ACP}=\beta\{2v_{in}(V_{gs0}-V_t)+a\ V_{in}^2\}$$

$V_{in}<0V$:

$$i_{ACN}=\beta\{(1+a)[(V_{gs0}-V_t)v_{in}+\tfrac{1}{2}V_{in}^2]+(1-a)[(V_{gs0}-v_{in}-V_t)v_{in}\tfrac{1}{2}V_{in}^2]\}$$

$$i_{ACN}=\beta\{2v_{in}(V_{gs0}-V_t)+a\ V_{in}^2\}$$

Figure 8:
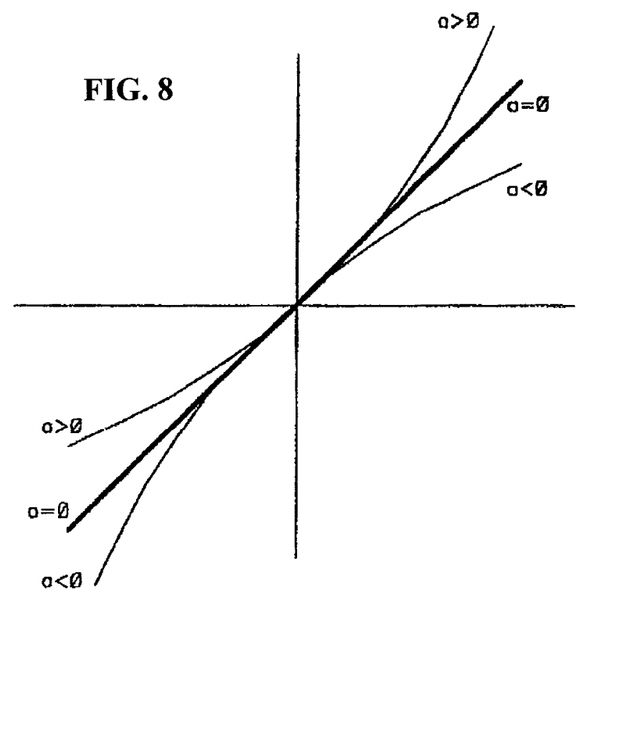
FIG. 8 depicts the transfer function implemented by the gain stage of FIG. 7.

It can therefore be seen that:

$$i_{AC}=i_{ACP}=i_{ACN}=\beta\{2v_{in}(V_{gs0}-V_t)+a\ V_{in}^2\}$$

for all $v_{in}$. The transfer function consists now of a linear term $2v_{in}$ ($V_{gs0}-V_t$), providing a linear gm-cell behavior and the desired square term, a $V_{in}^2$, needed for compensating for the distorted read signal. Since the magnitude of the square term can be set by the variable "a," this structure can be used to introduce a square function of programmable magnitude. Setting a=0 also allows for the disabling of the squaring function if it is not needed. FIG. 8 shows the transfer function of $v_{in}$ to $i_{AC}$ considering the cases a=0, a>0 and a<0.

Figure 9:
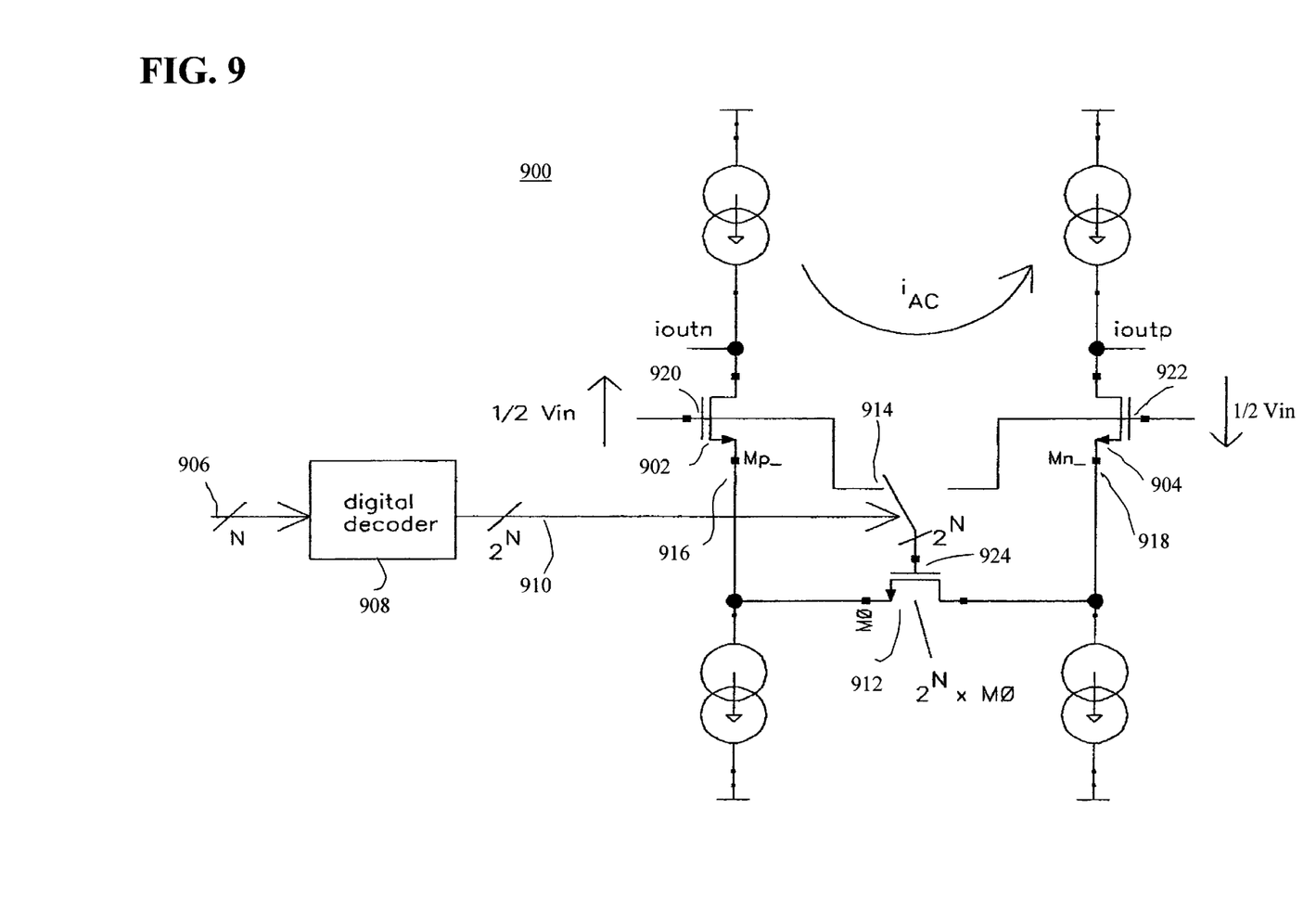
FIG. 9 depicts a schematic of a second embodiment for use with read/write channel of FIG. 1B.

Referring now to FIG. 9, there is shown a schematic diagram of a amplifier stage 900 for use in the MRA 126 which provides a distortion compensation circuit 912 with digitally controlled asymmetry among the transistors M1, M2 (702, 704 in FIG. 7). This allows digital control of the magnitude of the distortion compensation as described above. The amplifier stage 900 includes two source followers 902, 904, labeled "Mp" and "Mn", as described above. The distortion compensation circuit 912 includes a set of N NMOS transistors 912, labeled "M0", each coupled in parallel to the others, between the sources 916, 918 of the source followers 902, 904. Each of the gates 924 of the N NMOS transistors 912 include a digitally controlled switch 914 which allows each transistor's 912 gate 924 to be connected to either the gate 920 of source follower Mp 902 or to the gate 922 of source follower Mn 904. The amplifier stage 900 further includes a digital decoder 908 which decodes an N bit binary digital input value into $2^N$ signals, each of which controls one of the digitally controlled switches 914. An asymmetry/distortion compensation magnitude control value is provided on the input 906 to the digital decoder which decodes the value to control the digitally controlled switches as described below.

The output of the decoder 908 directly drives $2^N$ digitally controlled switches 914 which are connected to $2^N$ instances of transistor M0 912. Assuming the input 906=0 . . . ($2^N$−1)=0 . . . (m−1) with m=$2^N$, the decoding functions as follows: If the input 906=m/2, then the gates 924 of m/2 instances of M0 912 would get connected to the gate 920 of source follower Mp 902 and the remaining m/2 instances of M0 912 would get connected to the gate 922 of source follower Mn 904, therefore effectively providing two transistors M01 and M02 with a W/L =m/2 W(M0)/L(M0). Setting the input 906=0 connects all m instances of M0 912 to the gate 922 of Mn 904 and connects none of the instances of M0 912 to the gate 920 of Mp 902 for full negative compensation. Setting the input 906=m−1 connects all m instances of M0 912 to the gate 920 of Mp 902 for full positive compensation. Other values for the input 906 work accordingly and thereby balance the number of instances of M0 912 being connected to the gate of Mp 902 and Mn 904 respectively. Using multiple instances of M0 912 and connecting different (=asymmetric) numbers of them to Mp 902 and Mn 904 is a way of implementing asymmetric W/L ratios for the transistors being connected to the gates 920, 922 of Mp 902 and Mn 904. In other words the digital input 906 controls the magnitude of the square term in the transfer function of the presented structure as described above. The input 906 is effectively a digital representation of 'a' used in the formulas described above.

In one embodiment, the input 906 is generated by a programmable register which is calibrated during operation of the disk drive according to the expected or measured distortion from the read head. For such hard disk applications, the preferred bit width of N is 7 or 8 bits corresponding to $2^7$=128 or $2^8$=256 instances of transistor 912. It will be appreciated that the exact value of N is dependent on available area on the integrated circuit, the expected range of distortion expected and the resolution/accuracy with which it is desirable to compensate for that distortion.

The disclosed embodiments provide both the squaring and summing functions in a single circuit. The squaring function is implemented by using two MOS transistors as a differential load in a gain-cell and by using unequal channel width/length ratios for these transistors. By utilizing a single signal path, the need for separate signal paths for the distorted signal and the squared signal is eliminated. This further eliminates the need to add compensating delays and a summing circuit. Further, the disclosed embodiments use only CMOS transistors which are more cost effective and technologically compatible then bi-polar technologies. In addition, this structure can be realized with a supply voltage under 2 volts.

In an alternative embodiment, the disclosed circuit is implemented using PMOS transistors instead of NMOS transistors. In another embodiment, the generated square term of the input signal shows up as a $k_2$ harmonic in the spectral domain which allows the circuit to be used as a frequency doubler in RF applications.

It is to be noted that suitable transistor sizes specifying channel width-to-length ratios (measured in micrometers or microns) for the transistors which make up the depicted circuits have been omitted from the figures. It will be appreciated that suitable ratios may be chosen depending on the design requirements and the capabilities and limitations of the particular integrated circuit fabrication process used for implementation of the circuit as well as the performance requirements of the specific embodiment.

It is therefore intended that the foregoing detailed description be regarded as illustrative rather than limiting, and that it be understood that it is the following claims, including all equivalents, that are intended to define the spirit and scope of this invention.

We claim:

1. An amplifier stage comprising:
    a first source follower including a first transistor comprising a first source, a first gate and a first drain, said first drain coupled with a first current source and a first differential output, said first gate coupled with a first differential input, said first source coupled with a second current source;

a second source follower including a second transistor comprising a second source, a second gate and a second drain, said second drain coupled with a third current source and a second differential output, said second gate coupled with a second differential input, said second source coupled with a fourth current source;

a distortion compensator coupled between said first source follower and said second source follower, said distortion compensator comprising a differential load; and wherein said distortion compensator is operative to remove second order distortion from a differential analog signal input to said first and second differential inputs.

2. The amplifier stage of claim 1, wherein said differential load comprises:

a third transistor including a third source, a third gate and a third drain, said third source coupled with said second source, said third gate coupled with said first gate, said third drain coupled with said first source; and a fourth transistor including a fourth source, a fourth gate and a fourth drain, said fourth source coupled with said second source, fourth gate coupled with said second gate and said fourth drain coupled with said second source.

3. The amplifier stage of claim 2, wherein said first, second, third and fourth transistors are fabricated using a complementary MOS process.

4. The amplifier stage of claim 2, wherein said first, second, third and fourth transistors comprise PMOS transistors.

5. The amplifier stage of claim 2, wherein said first, second, third and fourth transistors comprise NMOS transistors.

6. The amplifier stage of claim 2, wherein said third transistor further comprises a first channel width-to-length ratio and said fourth transistor comprises a second channel width-to-length ratio, said first and second channel width-to-length ratios being unequal.

7. The amplifier stage of claim 1, wherein said first and second differential inputs are coupled with said first and second differential outputs using a single differential signal path.

8. The amplifier stage of claim 1, wherein said distortion compensator squares a differential signal input on said first and second differential inputs and sums said squared differential signal with said differential signal.

9. The amplifier stage of claim 8, wherein said distortion compensator squares said differential signal input with a programmable magnitude.

10. The amplifier stage of claim 1 operative to function with a supply voltage of less and 2 volts.

11. The amplifier stage of claim 1, wherein said differential load comprises a plurality of third transistors each comprising a third source, a third gate and a third drain, each of said third source coupled with said first source, each of said third drain coupled with said second source and each of said third gate being switchably coupled with one of said first and second gates.

12. The amplifier stage of claim 11, wherein the coupling of each of said third gate with said first and second gates is controlled by a digital decoder.

13. The amplifier stage of claim 11, wherein each of said plurality of third transistors comprise substantially equivalent channel width and length, and wherein said third gates of a portion of said plurality of third transistors are coupled with said first gate and said third gates of a remaining portion of said plurality of third transistors are coupled with said second gate.

14. The amplifier of claim 1 wherein said first and second differential inputs are coupled with a magneto-resistive read head of hard disk drive, said distortion compensator being further operative to remove second order distortion imparted in said differential analog signal by said read head.

15. A method of removing second order distortion from a differential analog input signal, the method comprising:

(a) receiving said differential analog input signal at first and second source followers;

(b) processing said differential analog input signal through a differential load;

(c) removing second order distortion from said differential analog input signal.

16. The method of claim 15, wherein:

said first source follower includes a first transistor comprising a first source, a first gate and a first drain, said first drain coupled with a first current source and a first differential output, said first gate coupled with a first differential input, said first source coupled with a second current source;

said second source follower includes a second transistor comprising a second source, a second gate and a second drain, said second drain coupled with a third current source and a second differential output, said second gate coupled with a second differential input, said second source coupled with a fourth current source; and wherein said differential load comprises:

a third transistor including a third source, a third gate and a third drain, said third source coupled with said second source, said third gate coupled with said first gate, said third drain coupled with said first source; and a fourth transistor including a fourth source, a fourth gate and a fourth drain, said fourth source coupled said second source, fourth gate coupled with said second gate and said fourth drain coupled with said second source.

17. The method of claim 16, wherein said first, second, third and fourth transistors are fabricated using a complementary MOS process.

18. The method of claim 16, wherein said third transistor further comprises a first channel width-to-length ratio and said fourth transistor comprises a second channel width-to-length ratio, said first and second channel width-to-length ratios being unequal.

19. The method of claim 15, wherein (b) further comprises using a single differential signal path.

20. The method of claim 15, wherein (c) further comprises squaring said differential analog input signal and summing said squared differential analog input signal with said differential analog input signal.

21. The method of claim 20, wherein (c) further comprises squaring said differential signal input with a programmable magnitude.

22. The method of claim 15 operative to function with a supply voltage of less than 2 volts.

23. The method of claim 15, wherein said differential load comprises a plurality of transistors being switchably coupled with one of said first and second source followers, and wherein (b) further comprises coupling a portion of said plurality of transistors with said first source follower and coupling a remaining portion of said plurality of transistors with said second source follower.

24. The method stage of claim 23, wherein the coupling of each of said transistors is controlled by a digital decoder.

25. The method stage of claim 23, wherein each of said plurality of transistors comprise substantially equivalent channel width and length.

26. An apparatus for removing second order distortion from a differential analog input signal, the apparatus comprising:
   a gain stage operative to receive a differential analog signal from an input source and amplify said signal to differential outputs;
   a differential load coupled with said gain stage and operative to remove second order distortion from said differential analog signal in line; said differential load comprising first and second transistors having unequal channel width-to-length ratios.

27. The apparatus of claim 26, wherein said differential load squares said differential analog input signal with a programmable magnitude.

28. The apparatus of claim 26, wherein said first transistor comprises a plurality of third transistors coupled in parallel and said second transistor comprises a plurality of fourth transistors coupled in parallel, each of said pluralities of third and fourth transistors having substantially equivalent channel widths and lengths, wherein said plurality of third transistors comprises a first number of said third transistors unequal to a second number of said plurality of fourth transistors in said plurality of fourth transistors.

29. The apparatus of claim 28, wherein said first and second numbers are programmable.

30. An amplifier stage comprising:
   a first source follower including a first transistor comprising a first source, a first gate and a first drain, said first drain coupled with a first current source and a first differential output, said first gate coupled with a first differential input, said first source coupled with a second current source;
   a second source follower including a second transistor comprising a second source, a second gate and a second drain, said second drain coupled with a third current source and a second differential output, said second gate coupled with a second differential input, said second source coupled with a fourth current source;
   a distortion compensator means coupled between said first source follower and said second source follower and operative to remove second order distortion from a differential analog signal input to said first and second differential inputs.

* * * * *

UNITED STATES PATENT AND TRADEMARK OFFICE
CERTIFICATE OF CORRECTION

PATENT NO. : 6,633,447 B2
DATED : October 14, 2003
INVENTOR(S) : Stephen J. Franck et al.

It is certified that error appears in the above-identified patent and that said Letters Patent is hereby corrected as shown below:

Title page,
Item [56], References Cited, U.S. PATENT DOCUMENTS, insert the following:
-- 6,043,943      3/2000      Rezzi et al.
   6,147,828      11/2000     Bloodworth et al. --.
After last cited U.S. PATENT DOCUMENTS, insert the following:
--                OTHER PUBLICATIONS "SYNCHRONOUS RECORDING CHANNELS - PRML & BEYOND", rev. 5.61 14.E.18, 1999, published by Knowledge Tek, Inc., Broomfield, Colorado.
"PRML: Seagate Uses Space Age Technology" available on the Internet at http://www.seagate.com/support/kb/disc/prml.html, 2 pages, last accessed 4/9/01.
"Technologies - PRML" available on the Internet at http://www.idema.org/about/industry/ind_tech_prml.html, 1 page, last accessed 4/9/01.
"Reference Guide - Hard Disk Drives" available on the Internet at http://www.storagereview.com/guide2000/ref/hdd, 13 pages, last accessed 4/9/01.
"MR. AND PRML: TECHNOLOGIES IN SYNERGY" available at on the Internet at http://www.lionsgate.com/Home/Baden/ public_html_index/SCSI/Quantum_White_Papers/MR_Head/MR, 4 pages, last accessed 4/9/01.
"A Tutorial on Convolutional Coding with Viterbi Decoding" available on the Internet at http://pw1.netcom.com/~chip.f/viterbi/tutorial.html, 10 pages, last accessed 4/9/01. --

Signed and Sealed this

Twenty-fourth Day of August, 2004

JON W. DUDAS
*Director of the United States Patent and Trademark Office*